United States Patent
Espy et al.

(10) Patent No.: US 10,719,238 B1
(45) Date of Patent: Jul. 21, 2020

(54) MEMORY FABRIC WITH RELIABILITY ZONE COMPRISING TWO OR MORE FABRIC ATTACHED MEMORY ENDPOINTS

(71) Applicant: EMC IP Holding Company LLC, Hopkinton, MA (US)

(72) Inventors: James Espy, Andover, MA (US); William P. Dawkins, Lakeway, TX (US); Dragan Savic, Brookline, MA (US); Amnon Izhar, Newton, MA (US); Patrick J. Weiler, Northborough, MA (US); Michael Robillard, Shrewsbury, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 271 days.

(21) Appl. No.: 15/782,384

(22) Filed: Oct. 12, 2017

(51) Int. Cl.
*G06F 3/06* (2006.01)
*G11C 14/00* (2006.01)

(52) U.S. Cl.
CPC ............ *G06F 3/061* (2013.01); *G06F 3/0614* (2013.01); *G06F 3/0683* (2013.01); *G11C 14/0045* (2013.01)

(58) Field of Classification Search
CPC ...... G06F 3/061; G06F 3/0614; G06F 3/0683; G11C 14/0045
See application file for complete search history.

(56) References Cited

U.S. PATENT DOCUMENTS

| | | | | |
|---|---|---|---|---|
| 5,742,792 A | * | 4/1998 | Yanai | G06F 3/0601 711/162 |
| 2005/0125617 A1 | * | 6/2005 | Ninose | G06F 11/2064 711/162 |
| 2007/0297406 A1 | * | 12/2007 | Rooholamini | H04L 12/185 370/390 |
| 2014/0297938 A1 | * | 10/2014 | Puthiyedath | G06F 12/08 711/105 |

OTHER PUBLICATIONS

Dr. Kimberly Keeton, "Memory-Driven Computing," Hewlett Packard Enterprise, International Conference on Massive Storage Systems and Technology (MSST), 2017, 66 pages.

* cited by examiner

*Primary Examiner* — Larry T Mackall
*Assistant Examiner* — Michelle T Bechtold
(74) *Attorney, Agent, or Firm* — Ryan, Mason & Lewis, LLP

(57) ABSTRACT

A first endpoint comprises a fabric attach point for attachment to a memory fabric, a first media controller, and a first non-volatile memory media. The memory fabric comprises a reliability zone comprising the first endpoint and at least a second endpoint. The first media controller is configured to receive, from at least one processor coupled to the first endpoint via the at least one fabric attach point, a memory fabric store command to store an object in the reliability zone. The first media controller is further configured to store the object in the first non-volatile memory media, to receive from the second endpoint a message indicating that the same object has been stored by the second endpoint, and to send (Continued)

to the at least one processor a single acknowledgement indicating that the at least one object has been stored in both the first and second endpoints of the reliability zone.

20 Claims, 8 Drawing Sheets

MEMORY FABRIC WITH RELIABILITY ZONE COMPRISING TWO OR MORE FABRIC ATTACHED MEMORY ENDPOINTS

FIELD

The field relates generally to memory fabrics, and more particularly to data reliability in memory fabrics.

BACKGROUND

Memory fabrics provide new means for attaching processors and memory via serialized connections and possibly switched connectivity. Memory fabrics support independent scaling of both capacity and bandwidth, while maintaining a load/store semantic access model and low latencies. Memory fabrics further support the abstraction of memory media, such that media controller functionality can be located on the memory device side of the memory fabric rather than the processor side as with dynamic random access memory (DRAM).

SUMMARY

Illustrative embodiments of the present invention provide techniques for implementing high data reliability memory fabric store operations in memory fabrics with minimized added latency.

In one embodiment, a first fabric attached memory endpoint comprises at least one fabric attach point for attachment of the first fabric attached memory endpoint to a memory fabric, a first media controller, and a first non-volatile memory media. The memory fabric comprises a reliability zone, the reliability zone comprising the first fabric attached memory endpoint and at least a second fabric attached memory endpoint. The first media controller is configured to receive, from at least one processor coupled to the first fabric attached memory endpoint via the at least one fabric attach point, a memory fabric store command to store at least one object in the reliability zone. The first media controller is also configured to store the at least one object in the first non-volatile memory media and to receive, from the second fabric attached memory endpoint, a message indicating that the at least one object has been stored by the second fabric attached memory endpoint. The first media controller is further configured to send, to the at least one processor, a single acknowledgement indicating that the at least one object has been stored by both the first and second fabric attached memory endpoints of the reliability zone.

In another embodiment, a method comprises receiving, at a first fabric attached memory endpoint in a memory fabric from at least one processor, a memory fabric store command to store at least one object in a reliability zone of the memory fabric, the reliability zone comprising the first fabric attached memory endpoint and at least a second fabric attached memory endpoint. The method also comprises storing the at least one object in a first non-volatile media of the first fabric attached memory endpoint and receiving, from the second fabric attached memory endpoint, a message indicating that the at least one object has been stored by the second fabric attached memory endpoint. The method further comprises sending, to the at least one processor, a single acknowledgement indicating that the at least one object has been stored by both the first and second fabric attached memory endpoints of the reliability zone.

In another embodiment, a computer program product comprises a non-transitory computer-readable storage medium having stored therein program code of one or more software programs, wherein the program code when executed by a media controller of a first fabric attached memory endpoint cause the first fabric attached memory endpoint to receive, from at least one processor, a memory fabric store command to store at least one object in a reliability zone of the memory fabric, the reliability zone comprising the first fabric attached memory endpoint and at least a second fabric attached memory endpoint. The program code when executed also causes the first fabric attached memory endpoint to store the at least one object in a first non-volatile media of the first fabric attached memory endpoint and to receive, from the second fabric attached memory endpoint, a message indicating that the at least one object has been stored by the second fabric attached memory endpoint. The program code when executed further causes the first fabric attached memory endpoint to send, to the at least one processor, a single acknowledgement indicating that the at least one object has been stored by both the first and second fabric attached memory endpoints of the reliability zone.

In another embodiment, a memory fabric comprises at least one processor comprising a media interface, at least one memory fabric expansion switch, and a plurality of fabric attached memory endpoints, each of the fabric attached memory endpoints having a fabric attach point for coupling to the media interface of the at least one processor via the at least one memory fabric expansion switch, two or more of the plurality of fabric attached memory endpoints being associated with a reliability zone. The at least one processor is configured to send a memory fabric store command to store at least one object in the reliability zone and to receive, from a first one of the two or more fabric attached memory endpoints of the reliability zone, a single acknowledgement indicating that the at least one object has been stored by both the first fabric attached memory endpoint and at least a second one of the fabric attached memory endpoints of the reliability zone. The first fabric attached memory endpoint is configured to store the at least one object in a first non-volatile memory media and the second fabric attached memory endpoint is configured to store the at least one object in a second non-volatile memory media. The first fabric attached memory endpoint is configured, prior to sending the single acknowledgement to the at least one processor, to receive a message from the second fabric attached memory endpoint indicating that the at least one object has been stored by the second fabric attached memory endpoint.

These and other illustrative embodiments include, without limitation, methods, apparatus, systems and processor-readable storage media.

DETAILED DESCRIPTION

Figure 1:
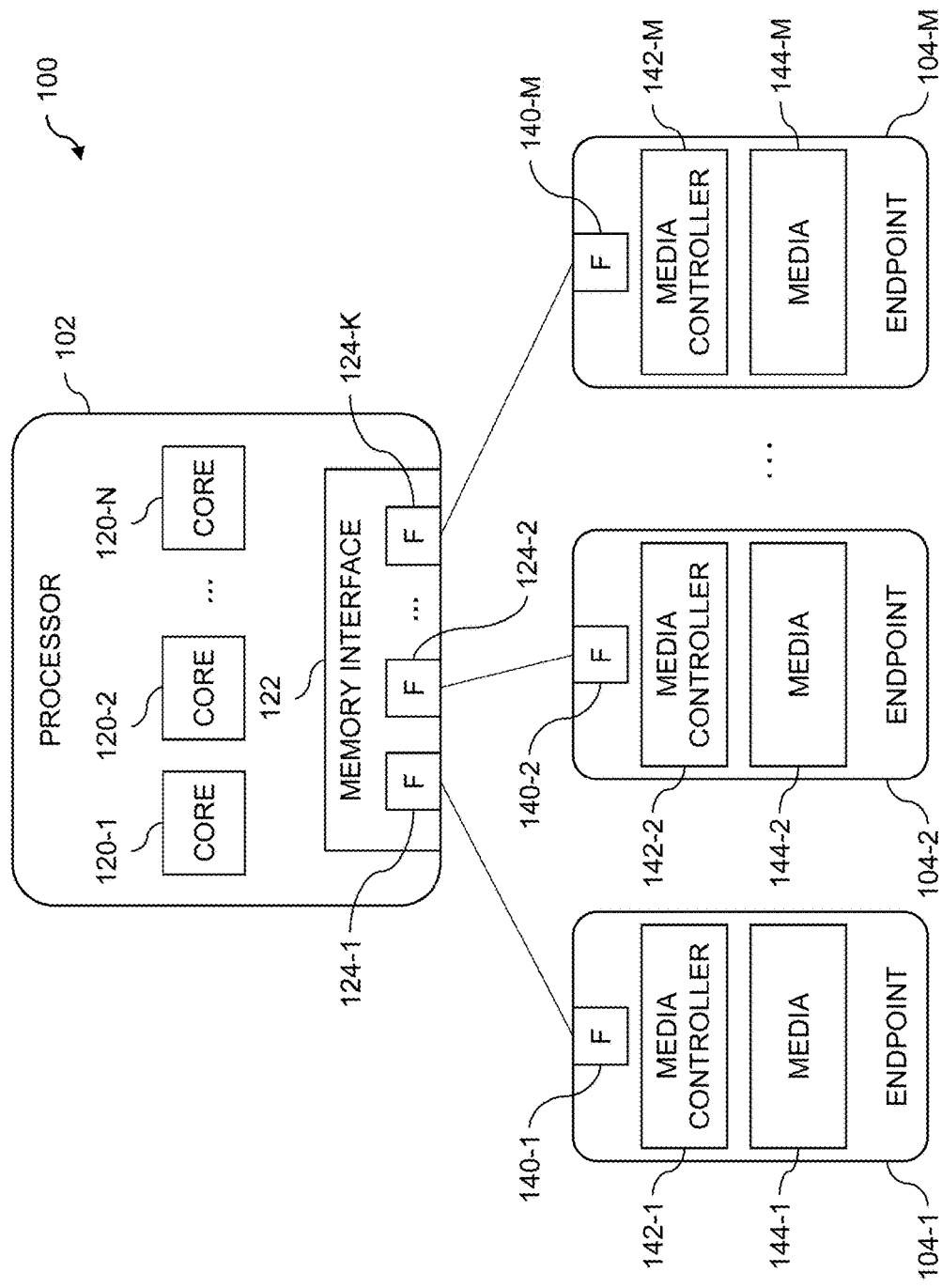
FIG. 1 is a block diagram of a memory fabric with a processor coupled to fabric attached memory endpoints in an illustrative embodiment of the invention.

Illustrative embodiments will be described herein with reference to exemplary memory fabrics and associated processors, fabric expansion switches and fabric attached memory endpoints. It is to be appreciated, however, that embodiments are not restricted to use with the particular illustrative memory fabrics shown. Accordingly, the term "memory fabric" as used herein is intended to be broadly construed, so as to encompass, for example, arrangements of fabric attached memory endpoints connected directly or via one or more bridging devices or fabric expansion switches to one or more processors supporting fabric attached memory.

Low latency, scalable, memory-semantic fabrics enable both the direct and pooled attach of persistent memory and storage class memory devices in a memory fabric. The persistence attribute of these memory devices make them candidates for selected storage services traditionally within the domain of input/output (I/O)-access storage devices or systems. Such storage services include durability, enhanced data reliability and availability. The value of these services and features in the memory domain is maximized when they are implemented at or near their very low load/store memory timing parameters, which are orders of magnitude lower than I/O storage transaction latencies.

As mentioned above, the emergence of non-volatile, low latency, high capacity density memory technologies enables durability at orders of magnitude lower memory-access latencies relative to traditional I/O storage. Durability alone, however, does not provide full data reliability or other services that may be required by particular applications. Memory fabrics and persistent memory together create an opportunity for durable, reliable, available and serviceable storage tier-like functionality at memory-type access performance levels. Implementation considerations for such services in the memory-type access domain are significantly different than in a traditional context switched I/O storage domain.

Contemporary processors with embedded caches are designed to deal with stall impacts resulting from tens (10s) of nanoseconds (ns) to low hundreds (100s) of ns DRAM access times. Any memory latency additions exacerbate stalling issues. Hence, memory fabrics should be designed to minimize additional latency caused by serialization/de-serialization and fabric switching (e.g., cut-through switches with few or no latency-adding features). Such added latency can be viewed as a "tax" against the otherwise high benefits of memory fabrics.

Methods realizing data reliability, availability and serviceability (RAS) services for memory-type access will incur added latency (i.e., a RAS latency tax) with corresponding impacts on processor stalling. Given memory fabrics with otherwise minimized latency tax, the challenge is to develop methods to add RAS services at a minimum RAS latency tax. Ideally, an individual atomic memory fabric store operation will complete inclusive of any selected RAS services with no or minimal RAS latency tax.

Processors which support only double data rate (DDR) memory attach have limited or no RAS capability. Some processors support hardware (HW) mirroring, while libraries and applications can utilize methods similar to redundant array of independent disks (RAID) or other erasure code (EC) techniques for storing data reliably across DDR channels. However, such configurations have limited availability, and processor failure strands all DDR attached data. Such configurations also require "cold" or offline DDR dual in-line memory module (DIMM) servicing.

For scale-out configurations, enhanced data reliability, availability and some level of serviceability may be achieved by mirroring to other attached nodes (e.g., InfiniBand (IB) or Ethernet scale-out connectivity). Remote direct memory access (RDMA) provides a fast mirroring mechanism. However, with latencies in the sub-10 microsecond (µs) range, RDMA atomic write transactions requiring higher data reliability and availability levels suffer a significant overall RAS latency tax.

The term "memory" herein refers to any type of computer memory accessed using memory access programming semantics (memory-type access). As used herein, the term "storage" refers to any resource that is accessed via I/O device semantics (storage-type access), such as read and write system calls. Memory fabrics utilizing fabric attached memory allow for increasing memory-type access beyond DDR DIMMs, which is fast compared to disk storage or other storage-type access. Generally, memory-type access refers to latencies in the 1's to 100's of nanoseconds range, while storage-type access refers to latencies in the 10's of microseconds range or higher.

Applications accessing memory fabrics utilizing persistent memory-based endpoints with added RAS services should be designed with a number of objectives. For example, such memory fabrics should achieve single memory (load/store semantic) access command/acknowledge operations. Such memory fabrics should also utilize simple memory fabric components yielding a lowest possible baseline operation access latency. Such memory fabrics should further incur a reduced or minimized latency for added reliability features (i.e., a minimum RAS latency tax).

Illustrative embodiments, as will be described below, provide solutions to one or more of the above problems to achieve one or more of the above-described objectives in memory fabrics that utilize persistent memory mirrored caching to provide data reliability services with load/store access semantics with minimal RAS latency tax.

FIG. 1 is a block diagram of a memory fabric 100 with a processor 102 having a number of processing cores 120-1, 120-2, . . . 120-N (collectively, cores 120) and a memory interface (MI) 122. The MI 122 provides a number of serialized memory fabric attach points or connections (F) 124-1, 124-2, . . . 124-K (collectively, memory fabric connections 124). The MI 122 provides a media agnostic memory controller, without corresponding media control.

The memory fabric connections 124 of the MI 122 connect to corresponding fabric attached memory endpoints 104-1, 104-2, . . . 104-M (collectively, endpoints 104) via respective serialized memory fabric attach points or connections (F) 140-1, 140-2, . . . , 140-M (collectively, fabric attach points 140).

It is important to note that although FIG. 1 shows a memory fabric 100 in which each memory fabric connection 124 of the MI 122 of processor 102 is connected to a corresponding serialized memory fabric attach point or connection 140 of one of the endpoints 104 (e.g., K=M), this is not a requirement. The MI 122 of the processor 102 may include more memory fabric connections 124 than the number of endpoints 104 (e.g., K>M) or vice versa (e.g., M>K). In some cases, it is desired for the MI 122 of processor 102 to have more memory fabric connections 124 than the number of endpoints 104 connected in the memory fabric 100 during normal operation, such that during servicing additional endpoints 104 can be attached to the MI 122 of processor 102 to permit hot-swapping of endpoints 104. Thus, each endpoint 104 may be pluggable for easy servicing as compared to DDR DIMMs, which must be serviced cold or offline.

The endpoint devices 104 are configured with respective media controllers (MC) 142-1, 142-2, . . . , 142-M (collectively MCs 142) and respective memory media 144-1, 144-2, . . . , 144-M (collectively memory media 144). The memory media 144, as will be described in further detail below, may be volatile or non-volatile memory media. Endpoints configured for enabling data reliability or other RAS services are configured with non-volatile memory media, but other endpoints not configured for data reliability or other RAS services may be configured with volatile memory media.

Figure 2:
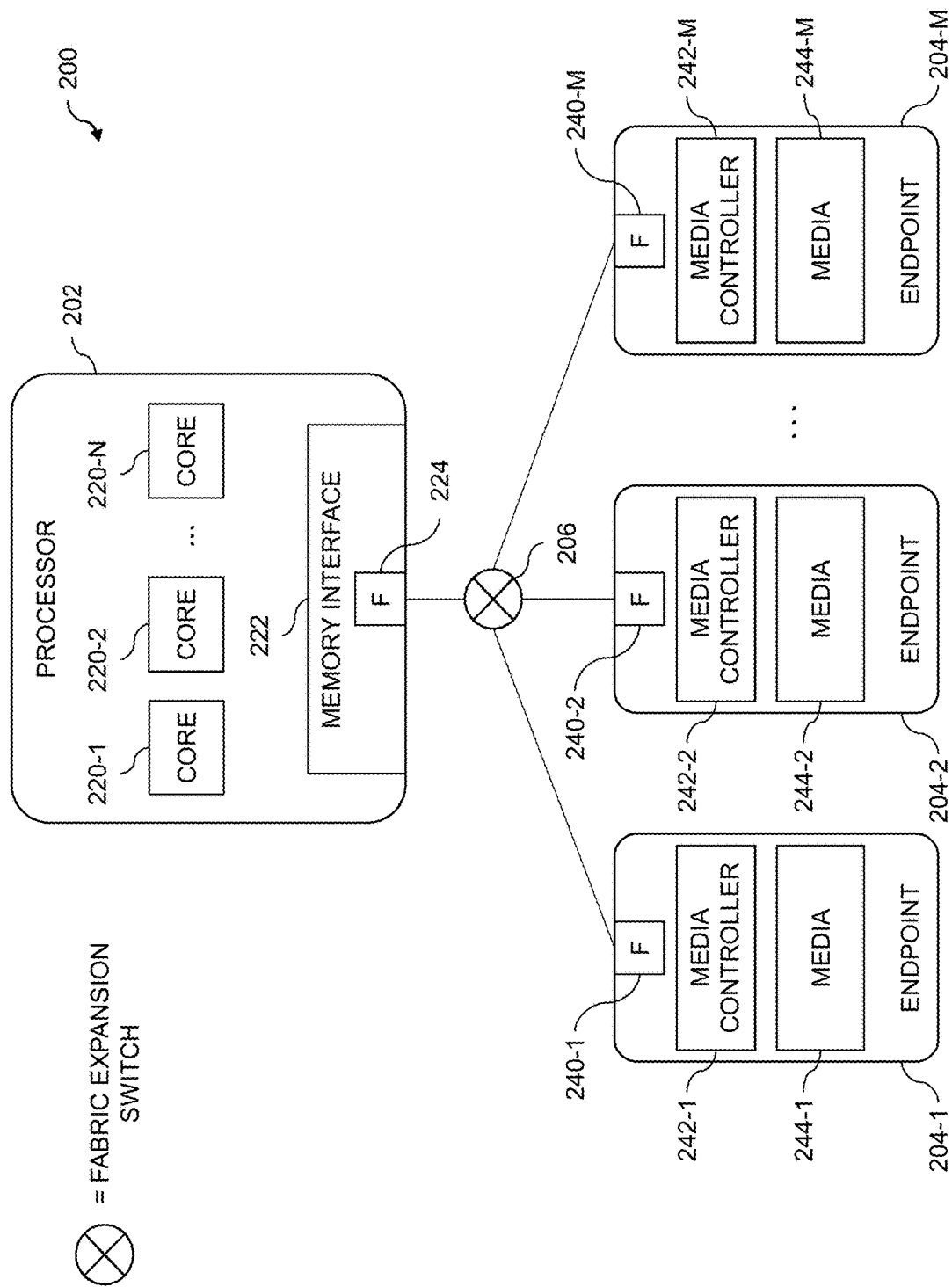
FIG. 2 is a block diagram of a memory fabric with a fabric expansion switch coupling a processor to fabric attached memory endpoints in an illustrative embodiment of the invention.

The memory fabric 100 of FIG. 1 is configured as a set of individual point-to-point connections between memory fabric connections 124 of the MI 122 of processor 102 and the fabric attach points 140 of endpoints 104. Embodiments, however, are not limited to such point-to-point connections. In other embodiments, a fan-out topology is used where multiple endpoints are connected to a processor via a memory fabric expansion switch. FIG. 2, described in detail below, illustrates an example of a memory fabric 200 utilizing a fan-out topology. Although not explicitly shown, in some embodiments the point-to-point and fan-out topologies may be combined. For example, one or more processors may connect to a first set of fabric attached memory endpoints using a fan-out topology and to a second set of fabric attached memory endpoints using a point-to-point topology.

FIG. 2, as mentioned above, shows a memory fabric 200 which utilizes a fan-out topology. The memory fabric 200 includes a processor 202 having a number of cores 220-1, 220-2, . . . , 220-N (collectively cores 220) and a MI 222. Whereas the MI 122 of processor 102 includes multiple memory fabric connections 124 to enable point-to-point connections to multiple endpoints, the MI 222 of processor 202 is shown with a single serialized memory fabric attach point or connection 224 for connection to fabric attached memory endpoints 204-1, 204-2, 204-M (collectively, endpoints 204) via a memory fabric expansion switch 206.

Similar to the endpoints 104, each of the endpoints 204 is configured with a respective serialized memory fabric attach point or connection (F), e.g., endpoint 204-1 includes fabric attach point 240-1, endpoint 204-2 includes fabric attach point 240-2, and endpoint 204-M includes fabric attach point 240-M. The fabric attach points 240-1, 240-2, . . . , 240-M are collectively referred to as fabric attach points 240. Each of the endpoints 204 is also configured with a respective MC and memory media, e.g., endpoint 204-1 is configured with MC 242-1 and memory media 244-1, endpoint 204-2 is configured with MC 242-2 and memory media 244-2, and endpoint 204-M is configured with MC 242-M and memory media 244-M. The MCs 242-1, 242-2, . . . , 242-M are collectively referred to as MCs 242, and the memory media 244-1, 244-2, . . . , 244-M are collectively referred to as memory media 244.

Although not shown in FIG. 2, the MI 222 of processor 202 may include multiple memory fabric connections for connecting to different sets of fabric attached memory endpoints, such as to a first set of endpoints utilizing a first memory fabric expansion switch and to a second set of endpoints utilizing point-to-point connections or a second memory fabric expansion switch. Various other arrangements of point-to-point and fan-out topologies, including combinations of point-to-point and fan-out topologies, may be used in other embodiments.

Figure 3:
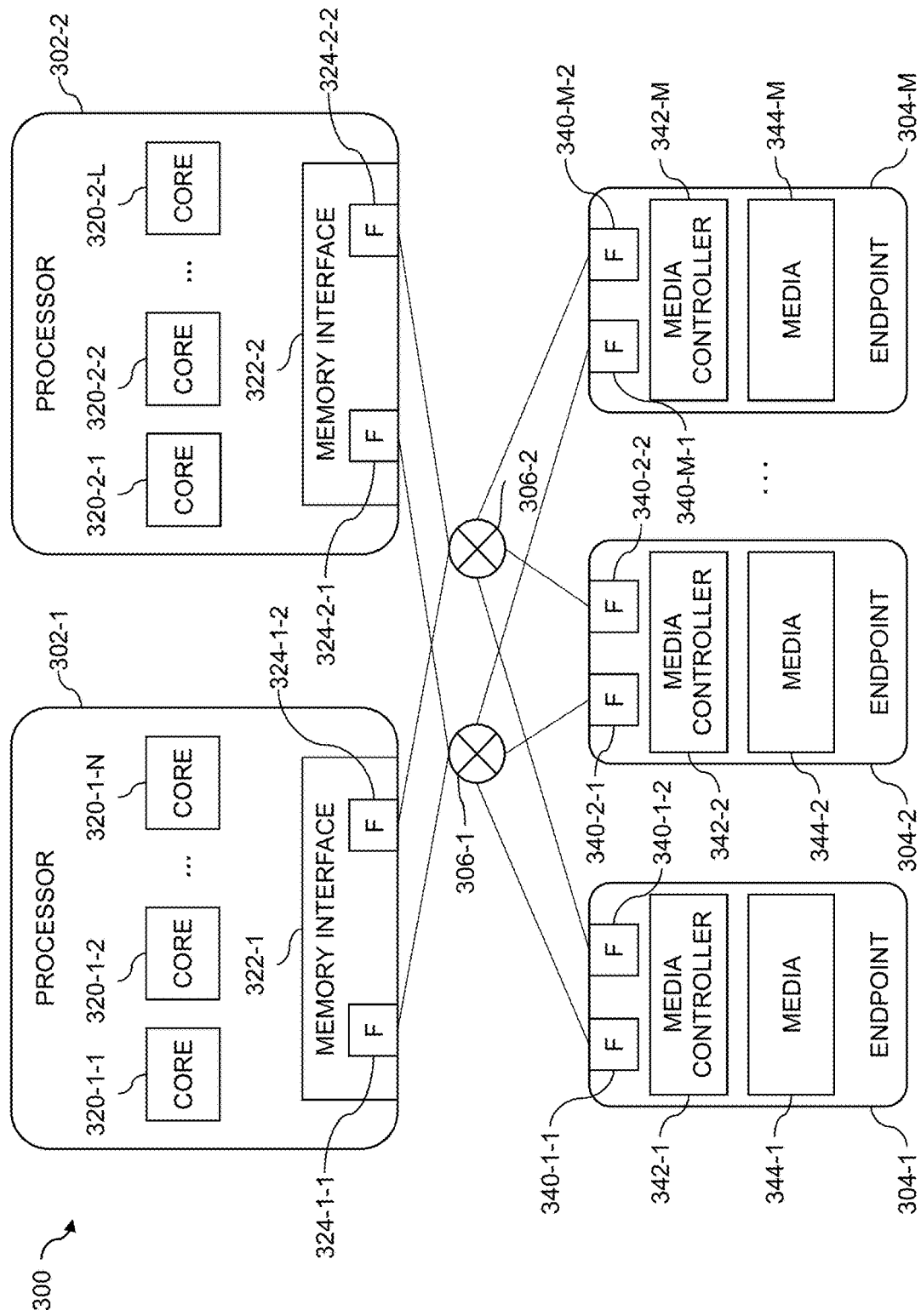
FIG. 3 is a block diagram of a high availability memory fabric with multiple processors coupled to a shared pool of fabric attached memory endpoints in an illustrative embodiment of the invention.

Memory fabrics may also be configured with shared pools of fabric attached memory endpoints. FIG. 3 illustrates an example of such an arrangement, with a memory fabric 300 comprising multiple processors 302-1 and 302-2 (collectively, processors 302) connected to shared pools of fabric attached memory endpoints 304-1, 304-2, . . . , 304-M (collectively, endpoints 304) via memory fabric expansion switches 306-1 and 306-2 (collectively, memory fabric expansion switches 306).

Processor 302-1 is configured with cores 320-1-1, 320-1-2, . . . , 320-1-N (collectively, cores 320-1) and a MI 322-1 with serialized memory fabric attach points or connections (F) 324-1-1 and 324-1-2 (collectively, memory fabric connections 324-1). Processor 302-2 is similarly configured with cores 320-2-1, 320-2-2, . . . , 320-2-L (collectively cores 320-2) and a MI 322-2 with serialized memory fabric attach points or connections (F) 324-2-1 and 324-2-2 (collectively, memory fabric connections 324-2).

The memory fabric connections 324-1 and 324-2, collectively referred to as memory fabric connections 324, couple the processors 302 to the endpoints via the memory fabric expansion switches 306. Each of the endpoints 304 is configured with two memory fabric attach points or connections (F), e.g., endpoint 304-1 is configured with fabric attach points 340-1-1 and 340-1-2 (collectively, fabric attach points 340-1), endpoint 304-2 is configured with fabric attach points 340-2-1 and 340-2-2 (collectively, fabric attach points 340-2), and endpoint 304-M is configured with fabric attach points 340-M-1 and 340-M-2 (collectively, fabric attach points 340-M). The fabric attach points 340-1, 340-2, . . . , 340-M are collectively referred to as fabric attach points 340. Each of the endpoints 304 is also configured with a respective MC and memory media, e.g., endpoint 304-1 is configured with MC 342-1 and memory media 344-1, endpoint 304-2 is configured with MC 342-2 and memory media 344-2, and endpoint 304-M is configured with MC 342-M and memory media 344-M. The MCs 342-1, 342-2, . . . , 342-M are collectively referred to as MCs 342, and the memory media 344-1, 344-2, . . . , 344-M are collectively referred to as memory media 344.

The memory fabric 300 illustrates an example of high availability (HA) connectivity, in that each of the processors 302 has multiple connection paths to each of the endpoints 304 (e.g., a first connection path through memory fabric expansion switch 306-1 and a second connection path through memory fabric expansion switch 306-2). HA configurations support multi-pathing and non-disruptive serviceability. While FIGS. 1 and 2 and other figures such as FIGS. 6-8 described below show non-HA configurations for clarity of illustration, it is to be appreciated that any of the memory fabrics of FIG. 1, 2 or 6-8 may alternatively be configured with HA connectivity by providing multiple memory fabric expansion switches or multiple point-to-point connections between processors and fabric attached memory endpoints.

Although FIG. 3 shows each of the processors 302 with only two memory fabric connections in its associated MI and each of the endpoints 304 with only two fabric attach points, embodiments are not so limited. Each of the processors 302 may be configured with any desired number of memory fabric connections in its associated MI and each endpoint 304 may be configured with any desired number of fabric attach points depending on the desired topology configuration. Similarly, more than two memory fabric expansion switches 306 may be utilized depending on the number of and arrangements of processors 302 and endpoints 304. Further, although only two processors 302 are shown in FIG. 3 for clarity of illustration, it is to be appreciated that more than two processors may connect to the shared pool of endpoints 304.

In the memory fabrics 100, 200 and 300, the topologies and memory fabric attach or scaling mechanisms are structured to minimize memory-access latencies (e.g., in the low 100s of ns). For example, the memory fabric expansion switches 206 and 306 may be configured as cut-through switches with minimized feature sets. Additionally, memory fabrics 100, 200 and 300 are configured to support endpoint serviceability opportunities including hot-plugging or hot-swapping.

The memory fabrics 100, 200 and 300 illustrate examples of memory fabric data plane configurations. Some or all of the endpoints 104, 204, 304 may be configured with persistent memory media 144, 244, 344, respectively. The endpoints 104, 204, 304 may be hot-pluggable field replaceable units (FRUs). The memory fabrics 100, 200, 300 may be configured with control plane capabilities for endpoint discovery, hot pluggability, address allocation, etc.

Fabric attached memory endpoints, as mentioned above, may be configured with volatile memory media (e.g., DRAM media) or non-volatile memory media. Fabric attached memory endpoints supporting high data reliability or more generally RAS services utilize non-volatile media. Non-volatile media may be roughly divided into two categories for purposes of explanation below: (1) non-volatile memory media with access timing meeting specified DDR DRAM requirements, e.g., non-volatile memory media that can operationally replace DRAM on a DDR channel; and (2) non-volatile memory media with access timing slower than specified DDR DRAM requirements, e.g., non-volatile memory media that requires a more transactional interface versus DDR. For the purposes of this document, non-volatile memory media in category (1) are referred to herein as persistent memory (PM), while non-volatile memory media in category (2) are referred to herein as storage class memory (SCM).

Figure 4:
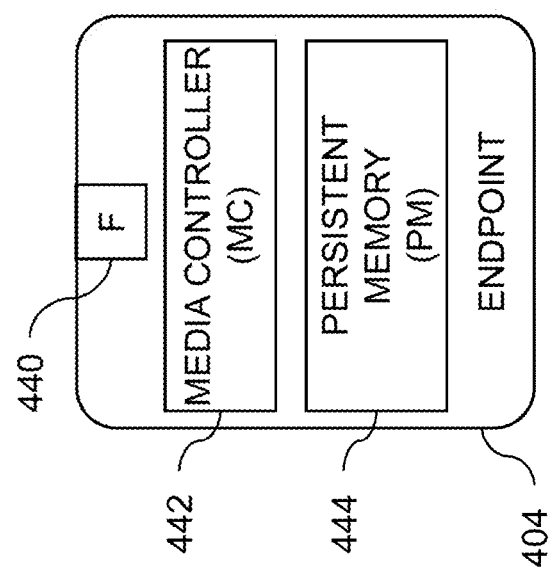
FIG. 4 is a block diagram of a fabric attached memory endpoint with persistent memory in an illustrative embodiment of the invention.
Figure 5:
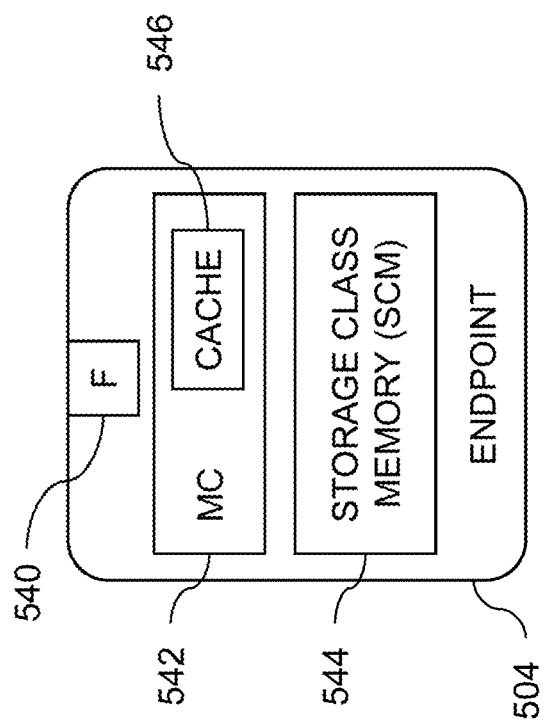
FIG. 5 is a block diagram of a fabric attached memory endpoint with storage class memory in an illustrative embodiment.

FIGS. 4 and 5 illustrate examples of fabric attached memory endpoints which utilize PM media and SCM media, respectively. FIG. 4 shows a fabric attached memory endpoint 404, also referred to herein as PM-based endpoint 404, which includes a serialized memory fabric attach point or connection (F) 440, a MC 442 and PM media 444.

FIG. 5 shows a fabric attached memory endpoint 504, also referred to herein as a SCM-based endpoint 504, which includes a serialized memory fabric attach point or connection (F) 540, a MC 542 with a cache 546, and SCM media 544. The cache 546 is configured as a fast PM-based cache (read and write back) with the SCM media 544 providing higher capacity density with lower price-per-gigabyte ($/GB) cost albeit with slower access timing. The faster PM-based cache 546 mitigates longer access times inherent in SCM devices, and requires no back-up energy scheme in the event of power failure. Host store operations (e.g., store operations from one or more processors), are considered completed once the data object or objects are written to the write-back cache 546 of the fabric attached memory endpoint 504. The data object or objects may be moved later to the SCM media 544 as a background operation. Host reads first examine the cache 546, and only access the SCM media 544 directly on read cache misses.

Although FIG. 5 shows an arrangement wherein the media of the endpoint 504 is SCM media 544, in other embodiments the media of the endpoint 504 may be PM media rather than SCM media. While the cache 546 is particularly useful in mitigating the longer access times inherent in SCM devices, a MC 542 with cache 546 may also be used in endpoints that utilize PM, such as endpoint 404 shown in FIG. 4. Similarly, although the endpoint 404 of FIG. 4 is shown with PM media 544, in other embodiments the endpoint 404 may be configured with SCM media.

Figure 6:
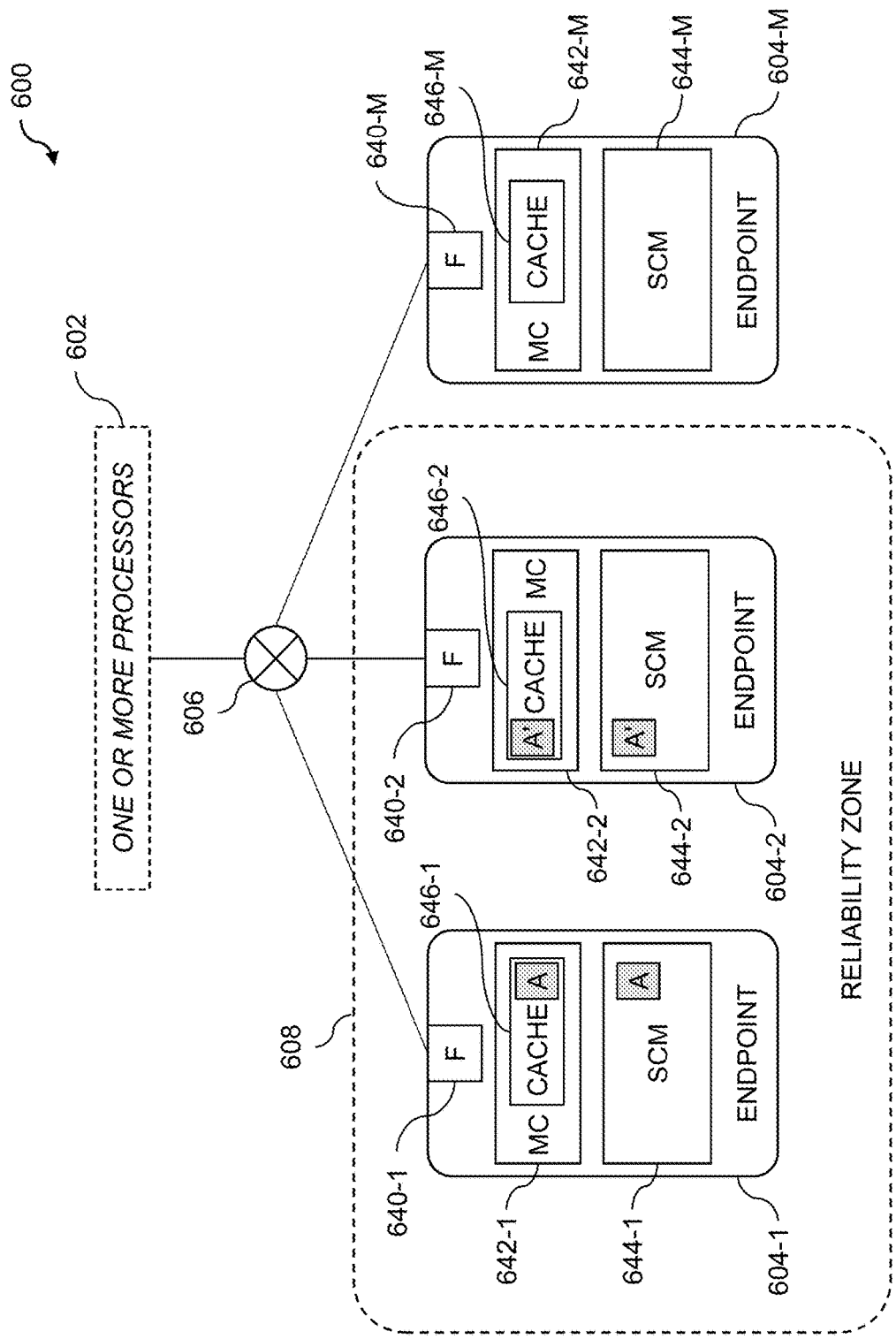
FIG. 6 is a block diagram of a memory fabric with multiple fabric attached memory endpoints forming a reliability zone in an illustrative embodiment.
Figure 7:
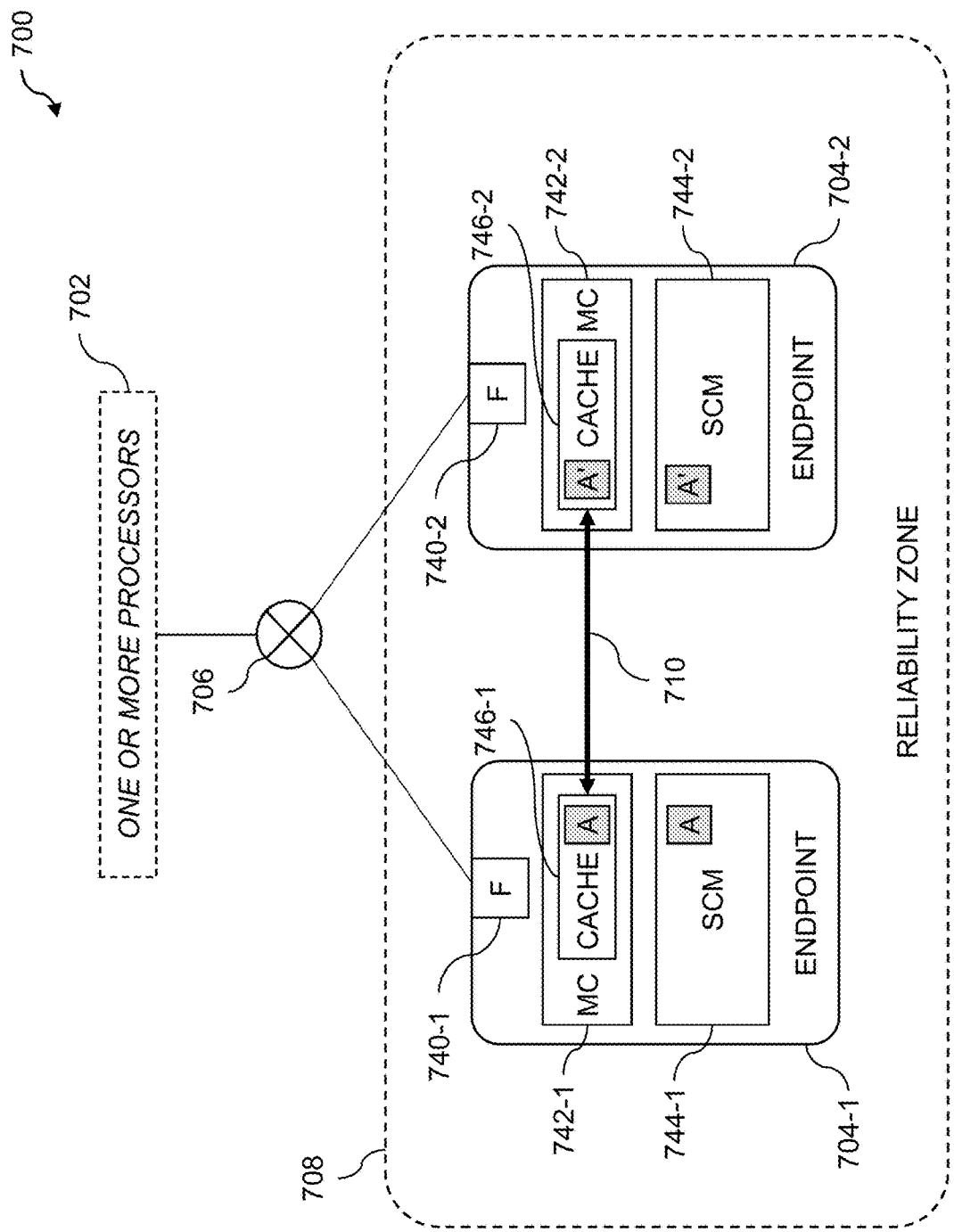
FIG. 7 is a block diagram of a memory fabric with multiple fabric attached memory endpoints utilizing a direct connect array approach for high data reliability memory fabric store operations in an illustrative embodiment.
Figure 8:
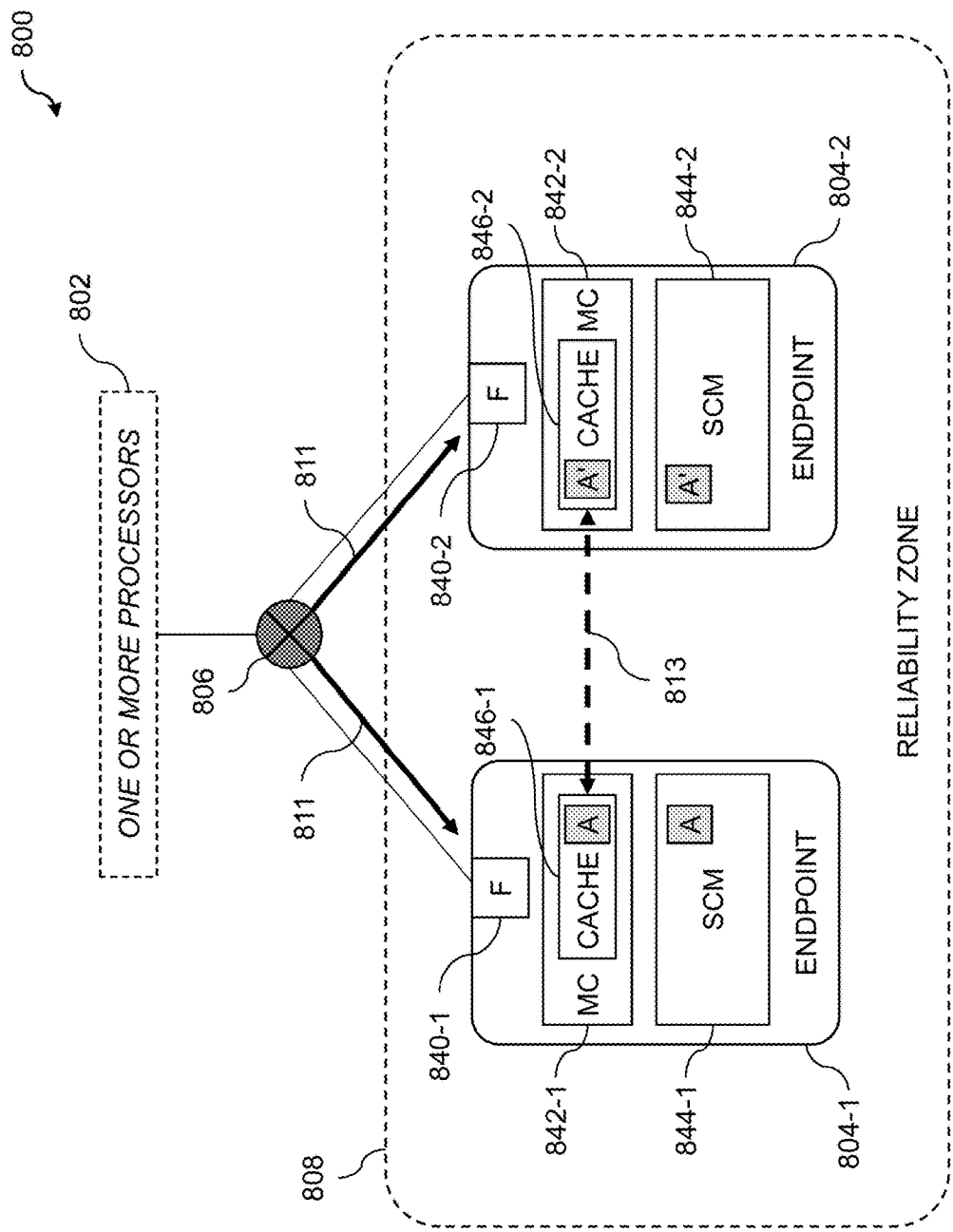
FIG. 8 is a block diagram of a memory fabric with multiple fabric attached memory endpoints utilizing a memory fabric switch multicast array approach for high data reliability memory fabric store operations in an illustrative embodiment.

In the discussion of FIGS. 6-8 below, it is assumed that each fabric attached memory endpoint is configured as a SCM-based endpoint (e.g., fabric attached memory endpoint 504). Embodiments, however, are not limited solely to use with SCM-based endpoints. Instead, any combination of PM and SCM-based endpoints may be utilized.

FIG. 6 shows a memory fabric 600, with one or more processors 602 coupled to SCM-based fabric attached memory endpoints 604-1, 604-2, . . . , 604-M (collectively, endpoints 604) via memory fabric expansion switch 606. Each of the one or more processors 602 may be configured with a number of cores, a MI and one or more serialized memory fabric attach points or connections in a manner similar to that described above with respect to processors 102, 202 and 302. Further, while the memory fabric 600 depicts a non-HA configuration, the memory fabric 600 could be configured with HA by providing multiple paths between the one or more processors 602 and the endpoints 604, such as via one or more additional memory fabric expansion switches or point-to-point connections between the processors 602 and endpoints 604.

Each of the endpoints 604 is configured with a serialized memory fabric attach point or connection (F), e.g., endpoint 604-1 includes fabric attach point 640-1, endpoint 604-2 includes fabric attach point 640-2, and endpoint 604-M includes fabric attach point 640-M. The fabric attach points 640-1, 640-2, . . . , 640-M are collectively referred to as fabric attach points 640. While FIG. 6 shows endpoints 604 each having one fabric attach point, embodiments are not limited to this arrangement. Endpoints 604 may be configured with any desired number of fabric attach points. Each of the endpoints 604 is also configured with a MC having a PM-based cache, e.g., endpoint 604-1 includes MC 642-1 with cache 646-1, endpoint 604-2 includes MC 642-2 with cache 646-2, and endpoint 604-M includes MC 642-M with cache 646-M. The MCs 642-1, 642-2, . . . , 642-M are collectively referred to as MCs 642, and the caches 646-1, 646-2, . . . , 646-M are collectively referred to as caches 646. Each of the endpoints 604 is further configured with SCM media, e.g., endpoint 604-1 includes SCM media 644-1, endpoint 604-2 includes SCM media 644-2, and endpoint 604-M includes SCM media 644-M. The SCM media 644-1, 644-2, . . . , 644-M are collectively referred to as SCM media

644. As mentioned above, in some embodiments one or more of the endpoints 604 may be configured as PM-based endpoints (e.g., the PM-based fabric attached memory endpoint 404 shown in FIG. 4) rather than SCM-based endpoints.

In the memory fabric 600, endpoints 604-1 and 604-2 are arranged in a reliability zone (RZ) 608 supporting high data reliability writes. The RZ 608 is shown as including two of the endpoints 604, but a RZ may more generally be a grouping of two or more endpoints 604 for the purpose of providing a data reliability service. Thus, a RZ may include three or more fabric attached memory endpoints in some embodiments. Further, while FIG. 6 shows an example of a memory fabric which includes only a single RZ 608, embodiments are not so limited. The endpoints 604 may be arranged in any desired number of RZs (given a sufficient number of endpoints and available addressable space for increasing data reliability), with different RZs having varying capacities and/or utilizing different memory technologies. In some cases, each RZ contains mutually exclusive endpoints (e.g., each RZ is formed from a distinct subset of the available endpoints). In other cases, a given endpoint may be part of two or more RZs. Further, a given RZ may include endpoints of different types, e.g., a RZ may include any combination of one or more PM-based endpoints and one or more SCM-based endpoints. As illustrated in FIG. 6, not all endpoints 604 need to be part of an RZ group. In the memory fabric 600, for example, endpoint 604-M is not part of a RZ. Further, a given endpoint that is part of a RZ need not dedicate all addressable space to increasing data reliability. Instead, a given endpoint, such as endpoint 604-1, may only allocate a fraction of its address space to the RZ group 608.

A control plane of memory fabric 600 is configured to discover and provide awareness of RZ groupings of the endpoints 604, as well as other features of the endpoints such as capacity, type of memory media (e.g., volatile or non-volatile, PM or SCM, etc.) The address space of memory fabric 600 is presented to hosts (e.g., processor 602 or applications which utilize one or more of the processors 602) as a range of different types of memory, such as a range of volatile, non-volatile and "higher reliability" non-volatile memory (e.g., memory that is part of a RZ). Host applications request memory space of a particular type (e.g., volatile, non-volatile or higher reliability non-volatile) based on data recovery point objectives (RPOs). Memory fabric load and store operations designated for accessing higher reliability non-volatile address regions will be described in further detail below in conjunction with FIGS. 7 and 8.

Data reliability for memory-type access, in some embodiments, is implemented by configuring the fabric attached memory endpoints of a RZ, such as endpoints 604-1 and 604-2 of RZ 608, to support MC-based cache mirroring (additionally or alternatively, mirroring to PM media of PM-based fabric attached memory endpoints). A single atomic host-side memory fabric store operation is acknowledged as complete only after the written object (e.g., one or more cache lines) has been stored on at least two MC write-back caches (or PM media of PM-based endpoints) of a selected RZ endpoint group. Since an RZ may have more than two endpoints, the store operation may be considered complete from the host perspective after the object is written and mirrored to the write caches of just two designated endpoints of a RZ having more than two endpoints. The combination of memory persistence and mirrored data reliability, possibly in combination with a HA-configuration and serviceability, establishes a high performance memory-type access storage tier with minimal added RAS latency tax.

Such an arrangement is depicted in the memory fabric 600, where the RZ group 608 includes endpoints 604-1 and 604-2. An object A and its mirrored image A' is stored in the endpoints 604-1 and 604-2, respectively, of RZ 608. More particular, object A is initially stored in the cache 646-1 of MC 642-1 of endpoint 640-1. The object A may later be moved to the SCM media 644-1 as a background operation. The mirrored image A' is initially stored in the cache 646-2 of MC 642-2 of endpoint 640-2. The mirrored image A' may later be moved to the SCM media 644-2 as a background operation. In embodiments wherein the endpoints 604-1 and 604-2 are configured as PM-based endpoints rather than SCM-based endpoints, the object A and its mirrored image A' would be stored in the respective PM media of the endpoints, rather than being stored initially in a PM-based cache implemented as part of an associated MC.

In some embodiments, it is desired to complete an atomic object write as quickly as possible. As such, a write acknowledgement can be sent to a host (e.g., processors 602 or applications utilizing processors 602) as soon as A and A' are written into the respective caches 646-1 and 646-2 of the MC 642-1 and 642-2 of endpoints 604-1 and 604-2. Subsequent copying or write operations to the SCM media 644 of endpoints 604 can happen as a background operation that itself has no impact on the object write operation from the host perspective.

The cached data (e.g., object A stored in cache 646-1 and its mirrored image A' stored in cache 646-2), as mentioned above, may subsequently be written to the SCM media 644-1 and 644-2 of the endpoints 604-1 and 604-2, respectively. While illustrated in FIG. 6 as a mirrored operation, embodiments are not so limited. In some embodiments, all or some portion of the mirrored cached data may be written to an SCM-based RAID or EC group for more capacity-efficient data reliability overhead and lower cost. The choice of whether to mirror particular objects or to use a RAID or EC group for writing to the SCM media may be based, in some embodiments, on the attributes of the RZ group 608 (e.g., number of endpoints in the RZ group 608, available capacity in the high reliability address space of the RZ group 608, the RPOs specified by the host request, etc.).

A host memory fabric load operation of object A (or its mirrored image A') first checks the appropriate cache 646-1 or 646-2, and then the SCM media 644-1 or 644-2 if there is a read cache miss. The object A and its mirrored image A' may be kept in the caches 646-1 and 646-2, respectively, based on policies implemented by the respective MCs 642-1 and 642-2. For example, one or both of the MCs 642-1 and 642-2 may retain the object A or its mirrored image A' in the cache 646-1 or cache 646-2 until that cache is full, at which point objects previously stored in that cache are evicted to make room for new objects to be written to the cache. Various mechanisms may be used to determine which data to remove from the cache, such as removing the oldest objects, removing infrequently-accessed objects, etc.

Failure of an endpoint in a RZ results in a fail-over operation to one or more other endpoints in the RZ. For example, failure of endpoint 604-1 in RZ 608 results in fail-over operation to endpoint 604-2, and possibly vice-versa. For RZs with more than two endpoints, the choice of which endpoint to switch to may be based on attributes of the RZ (e.g., active-passive vs. active-active, a specified fail-over ordering, load balancing, etc.). The fail-over operation may be handled by the memory fabric control plane (multi-pathing, address re-allocation, etc.), with fail-back after the failed endpoint is repaired or replaced. Various types of fail-over/fail-back mechanisms may be used.

In traditional processor-memory-storage architectures, memory-type access latency is in the 10s of ns range via DDR channels to volatile media such as DRAM, while access to storage incurs several orders of magnitude greater latency when accessed via I/O channels or other storage-type access to non-volatile media such as flash memory (e.g., NAND flash) and disk-based storage based on spinning magnetics with a lower associated $/GB storage cost. Storage can provide levels of data reliability, such as through RAID, erasure code (EC), mirroring, etc., as well as availability, serviceability, data protection (e.g., through snap-shotting or other back-up), etc. as specified in business or consumer application requirements (e.g., service level objectives (SLOs), RPOs, etc.). Actual storage architectures include variations of scale-out and scale-up configurations, from appliances to hyper-converged infrastructure. Regardless, particular time-sensitive applications (e.g., financial services applications) can realize atomic, durable, reliable and available, committed transactions only via slower I/O storage connections or other storage-type access.

Some embodiments improve on such traditional processor-memory-storage architectures by providing added data reliability embedded into a single memory fabric store operation with minimum added RAS latency tax. The baseline (e.g., best case) memory fabric access latency is determined by serialization/de-serialization processes, minimum fabric expansion switch latency, and endpoint latency (e.g., access latency of the PM-based cache in the MC of a SCM-based endpoint, access latency of the PM media of a PM-based endpoint). The PM-based cache of the MC of a SCM-based endpoint and/or the PM media of a PM-based endpoint may be configured with memory-type access timing meeting specified DRAM requirements. Minimum fabric expansion switch latency may be achieved by utilizing simple cut-through fabric expansion switches. A host memory fabric load or store operation to the endpoint is targeted to be in the range of typical memory-type access operations, e.g., in the 100's of ns range, rather than in the range of typical storage-type access operations, e.g., in the 10's to 1000's of μs range.

Various techniques may be utilized for implementing data reliability in a memory fabric with PM or SCM-based endpoints. A first approach may be host-based, where a host application or library executes two separate store operations to each of two separate endpoints (or extended further to a set of RAID/EC endpoints). Such an approach, however, violates the goal of a single store operation.

A second approach may be switch-based, where a host sends a single store operation to a memory fabric expansion switch coupled to two or more attached endpoints. The memory fabric expansion switch performs mirror (or RAID/EC) operations to designated endpoints, receives corresponding acknowledgments, and sends a single acknowledgement to the host. Such an approach, however, violates the goal of a simple, low latency memory fabric expansion switch.

In a third approach, a host sends a single store operation to one of a matched set of RZ-grouped endpoints. These endpoints together complete the high reliability store operation and send a single acknowledgment to the host. Any memory fabric expansion switches coupling the RZ-grouped endpoints to the host are not involved (e.g., simple cut-through switches with no added features may be used).

In a fourth approach, the host sends a single store operation to a memory fabric expansion switch with attached RZ-grouped endpoints. The memory fabric expansion switch performs a simple multicast to all endpoints of a designated RZ group. The endpoints together complete the high reliability store operation and send a single acknowledgment to the host.

The above-described approaches are presented by way of example. Additional or alternative approaches, including combinations of the above-described approaches, could be used in other embodiments.

FIGS. 7 and 8, described below, illustrate examples of the above-described third and fourth approaches, respectively. Both the third and fourth approaches support a single host store operation with increased data reliability (also referred to herein as a memory fabric store command to store at least one object in a reliability zone), with a simple (or no) memory fabric expansion switch, and minimal RAS latency tax. The third approach, illustrated in FIG. 7, is referred to as direct connect array, while the fourth approach, illustrated in FIG. 8, is referred to as memory fabric switch multicast array.

The direct connect array and memory fabric switch multicast array approaches are shown and described in FIGS. 7 and 8 with reference to SCM-based endpoints, utilizing PM-based caches implemented in their respective MCs with slower SCM media. The caching mechanisms described, however, are not always required, such as in embodiments where one or more PM-based endpoints are utilized. In some embodiments, a RZ may include a combination of one or more PM-based endpoints and one or more SCM-based endpoints. In such cases, the SCM-based endpoints will utilize caching mechanisms described below while the PM-based endpoints do not require the caching mechanisms described below. As described above, however, in some embodiments PM-based endpoints may be configured with caches in their respective MCs if desired.

FIG. 7 shows a memory fabric 700, with one or more processors 702 coupled to fabric attached memory endpoints 704-1 and 704-2 (collectively, endpoints 704) via memory fabric expansion switch 706. Although FIG. 7 shows the memory fabric 700 with the processors 702 coupled to the endpoints 704 via the memory fabric expansion switch 706, this is not a requirement. Instead, the processors 702 may be coupled to the endpoints via point-to-point connections similar to the memory fabric 100 of FIG. 1. Each of the one or more processors 702 may be configured with a number of cores, a MI and one or more serialized memory fabric attach points or connections in a manner similar to that described above with respect to processors 102, 202 and 302. Further, while the memory fabric 700 depicts a non-HA configuration, the memory fabric 700 could be configured with HA by providing multiple paths between the one or more processors 702 and the endpoints 704, such as via one or more additional memory fabric expansion switches or point-to-point connections between multiple fabric attach points of the processors 702 and endpoints 704.

Each of the endpoints 704 is configured with a serialized memory fabric attach point or connection (F), e.g., endpoint 704-1 includes fabric attach point 740-1 and endpoint 704-2 includes fabric attach point 740-2. The fabric attach points 740-1 and 740-2 are collectively referred to as fabric attach points 740. Each of the endpoints 704 is also configured with a MC having a PM-based cache, e.g., endpoint 704-1 includes MC 742-1 with cache 746-1 and endpoint 704-2 includes MC 742-2 with cache 746-2. The MCs 742-1 and 742-2 are collectively referred to as MCs 742, and the caches 746-1 and 746-2 are collectively referred to as caches 746. Each of the endpoints 704 is further configured with SCM media, e.g., endpoint 704-1 includes SCM media 744-1 and endpoint 704-2 includes SCM media 744-2. The SCM media 744-1 and 744-2 are collectively referred to as SCM 744. As mentioned above, in some embodiments one or more of the endpoints 704 may be configured as PM-based endpoints (e.g., the PM-based fabric attached memory endpoint 404 shown in FIG. 4) rather than as SCM-based endpoints.

In the memory fabric 700, endpoints 704-1 and 704-2 are arranged in a RZ 708 supporting high data reliability writes. Although the RZ 708 is depicted as including just two endpoints, RZs may more generally include groupings of two or more endpoints as discussed above. For clarity of illustration, only two endpoints 704 are shown in FIG. 7. It is to be appreciated, however, that the memory fabric 700 may include one or more additional endpoints that are not part of RZ 708, or which form one or more additional RZs. In the RZ 708, the endpoint 704-1 is designated as a "primary" endpoint and the endpoint 704-2 is designated as the "mirror" endpoint. The primary endpoint is the endpoint in a RZ that is responsible for providing the single acknowledgment to the host (e.g., one or more of the processors 702 or applications utilizing one or more of the processors 702).

As shown in FIG. 7, a high speed connection 710 is depicted coupling the MC 742-1 of endpoint 704-1 to the MC 742-2 of endpoint 704-2. The high speed connection 710 may be a dedicated non-memory fabric physical connection, a dedicated daisy-chain connection supported by the memory fabric 700, or another connection such as a routing through the memory fabric 700. While routing the high-speed connection 710 through the memory fabric 700 is simpler, such an approach adds latency and memory fabric congestion.

The primary endpoint 704-1 receives a host-initiated high data reliability memory fabric store command, which is addressed to an allocated high reliability non-volatile address space mapping in the RZ 708. The primary endpoint 704-1 writes an object A included with the high data reliability memory fabric store command into the cache 746-1 of MC 742-1, and sends a copy of the object, A', to the mirror endpoint 704-2 via the high speed connection 710. The mirror endpoint 704-2 writes the object A' to the cache 746-2 of its MC 742-2, and then sends an acknowledgement message over the high speed connection 710 back to the primary endpoint 704-1 indicating that the object A' was stored by the mirror endpoint 704-2. The primary endpoint 704-1 then sends a single memory fabric store acknowledgement back to the host. From the host perspective, a single memory fabric high data reliability store operation is thus completed.

The direct connect array approach shown in FIG. 7 illustrates a method which maintains memory fabric switching simplicity, in that the memory fabric expansion switch 706 does not perform any additional operation relative to a normal or non-high data reliability memory fabric store operation. In some embodiments, as discussed above, the memory fabric expansion switch 706 may be omitted and the endpoints 704 may be coupled to the one or more processors 702 directly via point-to-point connections. The direct connect array approach also has minimized latency, with little or no added memory fabric traffic. The direct connect array approach, however, adds complexity via the high speed connection 710 to the endpoints 704 of the RZ 708. The additional data reliability mirroring actions over high speed connection 710 add minimal RAS latency tax to an overall store latency (depending on the size of the object to be stored).

FIG. 8 shows a memory fabric 800, with one or more processors 802 coupled to fabric attached memory endpoints 804-1 and 804-2 (collectively, endpoints 804) via memory fabric expansion switch 806. Each of the one or more processors 802 may be configured with a number of cores, a MI and one or more serialized memory fabric attach points or connections in a manner similar to that described above with respect to processors 102, 202 and 302. Further, while the memory fabric 800 depicts a non-HA configuration, the memory fabric 800 could be configured with HA by providing multiple paths between the one or more processors 802 and the endpoints 804, such as via one or more additional memory fabric expansion switches or point-to-point connections between multiple fabric attach points of the processors 802 and endpoints 804.

Each of the endpoints 804 is configured with a serialized memory fabric attach point or connection (F), e.g., endpoint 804-1 includes fabric attach point 840-1 and endpoint 804-2 includes fabric attach point 840-2. The fabric attach points 840-1 and 840-2 are collectively referred to as fabric attach points 840. Each of the endpoints 804 is also configured with a MC having a PM-based cache, e.g., endpoint 804-1 includes MC 842-1 with cache 846-1 and endpoint 804-2 includes MC 842-2 with cache 846-2. The MCs 842-1 and 842-2 are collectively referred to as MCs 842, and the caches 846-1 and 846-2 are collectively referred to as caches 846. Each of the endpoints 804 is further configured with SCM media, e.g., endpoint 804-1 includes SCM media 844-1 and endpoint 804-2 includes SCM media 844-2. The SCM media 844-1 and 844-2 are collectively referred to as SCM 844. As mentioned above, in some embodiments one or more of the endpoints 804 may be configured as PM-based endpoints (e.g., the PM-based fabric attached memory endpoint 404 shown in FIG. 4) rather than as SCM-based endpoints.

In the memory fabric 800, endpoints 804-1 and 804-2 are arranged in a RZ 808 supporting high data reliability writes. Although the RZ 808 is depicted as including just two endpoints, RZs may more generally include groupings of two or more endpoints as discussed above. For clarity of illustration, only two endpoints 804 are shown in FIG. 8. It is to be appreciated, however, that the memory fabric 800 may include one or more additional endpoints that are not part of RZ 808, or which form one or more additional RZs. In the RZ 808, the endpoint 804-1 is designated as a "primary" endpoint and the endpoint 804-2 is designated as the "mirror" endpoint. The primary endpoint is the endpoint in a RZ that is responsible for providing the single acknowledgment to the host (e.g., one or more of the processors 802 or applications utilizing one or more of the processors 802).

While FIGS. 2, 3, 6 and 7 above depict memory fabric expansion switches 206, 306, 606 and 706 as memory fabric expansion switches with basic cut-through forwarding mechanisms with little or no added features to minimize base access latencies, the memory fabric expansion switch 806 of memory fabric 800 has an added multicast feature (e.g., the ability to multicast 811 to endpoints 804 as will be discussed in further detail below). In FIG. 8, this distinction is highlighted with shading of the memory fabric expansion switch 806 different from the shading of the memory fabric expansion switches 206, 306, 606 and 706 of FIGS. 2, 3, 6 and 7.

Whereas in the direct connect array approach of FIG. 7 the endpoints 704 are coupled via a high speed connection 710, the endpoints 804 of the memory fabric switch multicast array approach of FIG. 8 may be connected via a messaging connection 813. To highlight this distinction, the high speed connection 710 in FIG. 7 is illustrated as a bold connecting line while the messaging connection 813 in FIG. 8 is illustrated as a dashed connecting line. The messaging connection 813 may be a simple direct-connected acknowledge line, a message path via the memory fabric, etc.

In the memory fabric expansion switch multicast array approach illustrated in FIG. 8, a host-initiated high data reliability memory fabric store operation is tagged with the locations of the primary and mirror endpoints 804-1 and 804-2, respectively, of RZ 808. The memory fabric expansion switch 806 receives and subsequently multicasts 811 the tagged store operation to the respective endpoints 804 in the RZ 808. The endpoints 804-1 and 804-2 know which is the primary endpoint and which is the mirror endpoint from the tags included in the host-initiated high data reliability memory fabric store command. Once the mirror endpoint 804-2 writes the copy of object A (A') to its cache 846-2, the MC 842-2 of the endpoint 804-2 sends a message to the primary endpoint 804-1 over the messaging connection 813. At roughly the same time that the mirror endpoint 804-2 writes the copy of object A to its cache 846-2, the primary endpoint 804-1 writes the object A to its cache 846-1. The endpoints 804-1 and 804-2 can thus perform respective cache writes (of the object A and its copy A') at roughly the same time. There may be slight variations in timing based on latency of the paths to the different endpoints 804-1 and 804-2, other operations being performed on one or more of the endpoints 804-1 and 804-2, different hardware utilized for the endpoints 804-1 and 804-2, etc.

On receiving the message over the messaging connection 813 indicating that the object A' has been stored by the mirror endpoint 804-2, the primary endpoint 804-1 sends a single memory fabric store acknowledgment to the host that initiated the high data reliability memory fabric store operation. Similar to the direct connect array approach, from the host perspective, a single memory fabric high data reliability store operation is thus completed.

Compared with the direct connect array approach, the memory fabric switch multicast array approach keeps the endpoints 804 of the RZ 808 simpler, but adds minimal complexity and potential latency to the memory fabric expansion switch 806 with moderate added memory fabric traffic. The additional data reliability multicasting 811 adds minimal RAS latency tax to the overall store latency (depending on the size of the object to be stored).

It should be noted that, in the memory fabric switch multicast array approach, additional added mirroring is supported via multicasting to larger RZ groups (e.g., an RZ with more than two endpoints). For example, an RZ may support a single primary endpoint storing an object A with two mirror endpoints storing objects A' and A". The memory fabric expansion switch 806 could multicast to all three endpoints (the primary endpoint and both mirror endpoints), and the mirror endpoints would send acknowledgements simultaneously or near simultaneously to the primary endpoint with theoretically no added latency.

Embodiments provide methods for adding data reliability services to memory fabric store commands with minimum added RAS latency tax. Thus, some embodiments effectively present a storage tier with access latencies 2-3 orders of magnitude faster than a corresponding I/O solid state disk (SSD) storage supporting similar mirroring. The high data reliability memory fabric store operations are maintained in the memory-type access latency range. Some embodiments provide for high data reliability memory fabric store operations with memory-type access latencies utilizing RZ groupings of fabric attached memory endpoints having a high speed direct connection between such endpoints, with the memory fabric not otherwise being impacted. Other embodiments provide for high data reliability memory fabric store operations with memory-type access latencies utilizing RZ groupings of fabric attached memory endpoints utilizing a memory fabric expansion switch with added multicasting capability.

High data reliability memory fabric store operations can be useful in a wide variety of usage scenarios, wherein an application requires fast responses, such as in business applications requiring increasingly fast responses involving large data set analysis results, online transactions, etc. Certain data types, e.g., financial data, require reliable and available data storage. Scalable memory fabrics, combined with fabric attached memory endpoints with persistent memory (either via a PM media such as in the fabric attached memory endpoint 404 of FIG. 4 or via a PM-based cache in a MC such as in the fabric attached memory endpoint 504 of FIG. 5) and the above-described direct connect array or memory fabric switch multicast array approaches yield operations at 2-3 orders of magnitude (e.g., 100×) faster than traditional I/O storage.

Memory fabrics, such as memory fabrics 100, 200, 300, 600, 700 and 800 described herein, may be implemented in various types of processing platforms or other computing systems.

A computing system may include one or more processors (e.g., processors 102, 202, 302, 602, 702, 802) which may comprise microprocessors, microcontrollers, application-specific integrated circuits (ASICs), field-programmable gate arrays (FPGAs) or other types of processing circuitry including portions or combinations of such circuitry elements.

As mentioned above, processors (e.g., processors 102, 202, 302, 602, 702 and 802) include respective memory interfaces (e.g., MIs 122, 222, 322) with serialized memory fabric attach points or connections (e.g., memory fabric connections 124, 224, 324). Such memory interfaces may comprise memory interfaces of a Gen-Z memory fabric architecture, developed by the Gen-Z Consortium®. Such memory fabric connections may comprise Peripheral Component Interconnect Express (PCIe) connections or other connections including those used in Gen-Z memory fabric architectures. In some embodiments, processor connections to memory fabric may be via bridge devices between existing standard or proprietary processor parts and the memory fabric.

Processors may be coupled to fabric attached memory endpoints in memory fabrics via memory fabric expansion switches (e.g., memory fabric expansion switches 206, 306, 606, 706, 806). Such memory fabric expansion switches may comprise those used in the Gen-Z memory fabric architecture described above, which may be suitably modified to provide multicast features for embodiments utilizing memory fabric switch multicast array approaches.

Fabric attached memory endpoints (e.g., 104, 204, 304, 404, 504, 604, 704, 804) may comprise various form factors, such as serial interface-connected, pluggable storage protocol devices, etc. The fabric attached memory endpoints may include serialized memory fabric attach points or connections (e.g., memory fabric attach points 140, 240, 340, 440, 540, 640, 740, 840) which, similar to the memory fabric connections of processors, may comprise PCIe connections or other connection including those used in Gen-Z memory fabric architectures.

The fabric attached memory endpoints also implement media controllers (e.g., MCs 142, 242, 342, 442, 542, 642, 742 and 842), which may comprise microprocessors, microcontrollers, ASICs, FPGAs, etc. The media controllers are endpoint specific, as compared to "host" side processors which execute applications. The media controllers, however, may be configured to perform certain functions off-loaded by applications and storage services.

The fabric attached memory endpoints also implement media, which may be volatile or non-volatile as discussed above. Examples of volatile media which may be utilized as media for fabric attached memory endpoints include DRAM.

Non-volatile media, as discussed above, may be broadly split into PM and SCM categories. Examples of PM non-volatile media include spin-transfer torque magnetic random-access memory (STT-MRAM), non-volatile random-access memory (NVRAM) such as Nano-RAM available from Nantero®, etc. More generally, PM non-volatile media includes any type of non-volatile memory which provides memory-type access timing meeting specified DDR DRAM standards. The above describe PM non-volatile media may also be used to implement the PM-based caches (e.g., caches 546, 646, 746, 846) of media controllers of fabric attached memory endpoints utilizing SCM media.

Examples of SCM non-volatile media include resistive random-access memory (ReRAM), 3D XPoint™ from Intel®, etc.

Functionality for providing high data reliability memory fabric store operations may be implemented at least in part in the form of one or more software programs stored in memory and executed by a processor of a processing device, such as the media controller of a fabric attached memory endpoint or in the processors coupled to fabric attached memory endpoints. The memory may comprise random access memory (RAM), read-only memory (ROM) or other types of memory, in any combination. The memory should be viewed as an illustrative example of what is more generally referred to as "computer-readable storage media" storing executable program code of one or more software programs.

Articles of manufacture comprising such computer-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising computer-readable storage media can be used.

It should again be emphasized that the above-described embodiments are presented for purposes of illustration only. Many variations and other alternative embodiments may be used. For example, the disclosed techniques are applicable to a wide variety of other types of memory fabrics in which it is desirable to provide high data reliability memory fabric store operations as described herein. Also, the particular configurations of memory fabric and device elements shown in the figures can be varied in other embodiments. Thus, for example, the particular type of non-volatile media used on fabric attached memory endpoints deployed in a given embodiment may be varied. Other features of the illustrative embodiments can also be varied. Moreover, the various assumptions made above in the course of describing the illustrative embodiments should also be viewed as exemplary rather than as requirements or limitations. Numerous other alternative embodiments within the scope of the appended claims will be readily apparent to those skilled in the art.

What is claimed is:

1. A first fabric attached memory endpoint comprising:
    at least one fabric attach point for attachment of the first fabric attached memory endpoint to a memory fabric;
    a first media controller; and
    a first non-volatile memory media;
    wherein the memory fabric comprises a reliability zone, the reliability zone comprising the first fabric attached memory endpoint and at least a second fabric attached memory endpoint;
    wherein the first media controller is configured:
        to receive, from at least one processor coupled to the first fabric attached memory endpoint via the at least one fabric attach point, a memory fabric store command to store at least one object in the reliability zone;
        to store the at least one object in the first non-volatile memory media;
        to receive, from the second fabric attached memory endpoint, a message indicating that the at least one object has been stored by the second fabric attached memory endpoint; and
        to send, to the at least one processor, a single acknowledgement indicating that the at least one object has been stored by both the first and second fabric attached memory endpoints of the reliability zone;
    wherein the first media controller is configured to receive the memory fabric store command via a memory fabric expansion switch coupled between the first fabric attached memory endpoint and the at least one processor;
    wherein the memory fabric store command is tagged with endpoint locations of the first fabric attached memory endpoint and the second fabric attached memory endpoint, the memory fabric expansion switch being configured to multicast the memory fabric store command to the endpoint locations of the first fabric attached memory endpoint and the second fabric attached memory endpoint tagged in the memory fabric store command; and
    wherein the memory fabric store command designates the first fabric attached memory endpoint as a primary endpoint responsible for sending the single acknowledgement and designates the second fabric attached memory endpoint as a mirror endpoint responsible for sending the message to the primary endpoint responsive to storing the at least one object at the second fabric attached memory endpoint.

2. The first fabric attached memory endpoint of claim 1 wherein:
    the first non-volatile memory media comprises storage class memory;
    the first media controller comprises a cache, the cache comprising persistent memory; and
    the first media controller is configured to send the single acknowledgement responsive to storing the at least one object in the cache prior to writing the at least one object stored in the cache to the first non-volatile memory media.

3. The first fabric attached memory endpoint of claim 2 wherein the persistent memory has access timing characteristics meeting specified dynamic random access memory (DRAM) requirements and the storage class memory has access timing characteristics slower than the specified DRAM requirements.

4. The first fabric attached memory endpoint of claim 1 wherein the memory fabric store command comprises the at least one object, and the first media controller is further configured to receive, over a physical connection between the first media controller and a second media controller of the second fabric attached memory endpoint, the message indicating that the at least one object has been stored by the second fabric attached memory endpoint.

5. The first fabric attached memory endpoint of claim 4 wherein the physical connection comprises at least one of:
   a non-memory fabric physical connection; and
   a dedicated daisy-chain connection supported by the memory fabric.

6. The first fabric attached memory endpoint of claim 1 wherein the first media controller is configured to receive, over a messaging connection between the first media controller and a second media controller of the second fabric attached memory endpoint, the message indicating that the at least one object has been stored by the second fabric attached memory endpoint.

7. The first fabric attached memory endpoint of claim 6 wherein the messaging connection comprises at least one of:
   a direct-connected acknowledge line; and
   a message path of the memory fabric.

8. A method comprising:
   receiving, at a first fabric attached memory endpoint in a memory fabric from at least one processor, a memory fabric store command to store at least one object in a reliability zone of the memory fabric, the reliability zone comprising the first fabric attached memory endpoint and at least a second fabric attached memory endpoint;
   storing the at least one object in a first non-volatile media of the first fabric attached memory endpoint;
   receiving, from the second fabric attached memory endpoint, a message indicating that the at least one object has been stored by the second fabric attached memory endpoint; and
   sending, to the at least one processor, a single acknowledgement indicating that the at least one object has been stored by both the first and second fabric attached memory endpoints of the reliability zone;
   wherein the memory fabric store command is received via a memory fabric expansion switch coupled between the first fabric attached memory endpoint and the at least one processor;
   wherein the memory fabric store command is tagged with endpoint locations of the first fabric attached memory endpoint and the second fabric attached memory endpoint, the memory fabric expansion switch being configured to multicast the memory fabric store command to the endpoint locations of the first fabric attached memory endpoint and the second fabric attached memory endpoint tagged in the memory fabric store command; and
   wherein the memory fabric store command designates the first fabric attached memory endpoint as a primary endpoint responsible for sending the single acknowledgement and designates the second fabric attached memory endpoint as a mirror endpoint responsible for sending the message to the primary endpoint responsive to storing the at least one object at the second fabric attached memory endpoint.

9. The method of claim 8 wherein:
   the first non-volatile memory media comprises storage class memory;
   a first media controller of the first fabric attached memory endpoint comprises a cache, the cache comprising persistent memory; and
   sending the single acknowledgement is responsive to storing the at least one object in the cache prior to writing the at least one object stored in the cache to the first non-volatile memory media.

10. The method of claim 8, further comprising:
    receiving, over a physical connection between a first media controller of the first fabric attached memory endpoint and a second media controller of the second fabric attached memory endpoint, the message indicating that the at least one object has been stored by the second fabric attached memory endpoint.

11. The method of claim 8 wherein the method further comprises receiving, over a messaging connection between a first media controller of the first fabric attached memory endpoint and a second media controller of the second fabric attached memory endpoint, the message indicating that the at least one object has been stored by the second fabric attached memory endpoint.

12. A computer program product comprising a non-transitory computer-readable storage medium having stored therein program code of one or more software programs, wherein the program code when executed by a first media controller of a first fabric attached memory endpoint cause the first fabric attached memory endpoint:
    to receive, from at least one processor, a memory fabric store command to store at least one object in a reliability zone of a memory fabric, the reliability zone comprising the first fabric attached memory endpoint and at least a second fabric attached memory endpoint;
    to store the at least one object in a first non-volatile media of the first fabric attached memory endpoint;
    to receive, from the second fabric attached memory endpoint, a message indicating that the at least one object has been stored by the second fabric attached memory endpoint; and
    to send, to the at least one processor, a single acknowledgement indicating that the at least one object has been stored by both the first and second fabric attached memory endpoints of the reliability zone;
    wherein the memory fabric store command is received via a memory fabric expansion switch coupled between the first fabric attached memory endpoint and the at least one processor;
    wherein the memory fabric store command is tagged with endpoint locations of the first fabric attached memory endpoint and the second fabric attached memory endpoint, the memory fabric expansion switch being configured to multicast the memory fabric store command to the endpoint locations of the first fabric attached memory endpoint and the second fabric attached memory endpoint tagged in the memory fabric store command; and
    wherein the memory fabric store command designates the first fabric attached memory endpoint as a primary endpoint responsible for sending the single acknowledgement and designates the second fabric attached memory endpoint as a mirror endpoint responsible for sending the message to the primary endpoint responsive to storing the at least one object at the second fabric attached memory endpoint.

13. The computer program product of claim 12 wherein the memory fabric store command comprises the at least one object, and wherein the program code when executed by the first media controller of the first fabric attached memory endpoint further causes the first fabric attached memory endpoint to receive, over a physical connection between the first media controller and a second media controller of the second fabric attached memory endpoint, the message indicating that the at least one object has been stored by the second fabric attached memory endpoint.

14. The computer program product of claim 13 wherein the physical connection comprises at least one of:
   a non-memory fabric physical connection; and
   a dedicated daisy-chain connection supported by the memory fabric.

15. The computer program product of claim 12 wherein the program code when executed by the first media controller of the first fabric attached memory endpoint further causes the first fabric attached memory endpoint to receive, over a messaging connection between the first media controller and a second media controller of the second fabric attached memory endpoint, the message indicating that the at least one object has been stored by the second fabric attached memory endpoint.

16. The computer program product of claim 15 wherein the messaging connection comprises at least one of:
   a direct-connected acknowledge line; and
   a message path of the memory fabric.

17. A memory fabric comprising:
   at least one processor comprising a media interface;
   at least one memory fabric expansion switch; and
   a plurality of fabric attached memory endpoints, each of the fabric attached memory endpoints having a fabric attach point for coupling to the media interface of the at least one processor via the at least one memory fabric expansion switch, two or more of the plurality of fabric attached memory endpoints being associated with a reliability zone;
   the at least one processor being configured:
      to send a memory fabric store command to store at least one object in the reliability zone; and
      to receive, from a first one of the two or more fabric attached memory endpoints of the reliability zone, a single acknowledgement indicating that the at least one object has been stored by both the first fabric attached memory endpoint and at least a second one of the fabric attached memory endpoints of the reliability zone;
   wherein the first fabric attached memory endpoint is configured to store the at least one object in a first non-volatile memory media and the second fabric attached memory endpoint is configured to store the at least one object in a second non-volatile memory media; and wherein the first fabric attached memory endpoint is configured, prior to sending the single acknowledgement to the at least one processor, to receive a message from the second fabric attached memory endpoint indicating that the at least one object has been stored by the second fabric attached memory endpoint;
wherein the memory fabric store command is sent to the first fabric attached memory endpoint and the second fabric attached memory endpoint via the at least one memory fabric expansion switch;
wherein the memory fabric store command is tagged with endpoint locations of the first fabric attached memory endpoint and the second fabric attached memory endpoint, the at least one memory fabric expansion switch being configured to multicast the memory fabric store command to the endpoint locations of the first fabric attached memory endpoint and the second fabric attached memory endpoint tagged in the memory fabric store command; and
wherein the memory fabric store command designates the first fabric attached memory endpoint as a primary endpoint responsible for sending the single acknowledgement and designates the second fabric attached memory endpoint as a mirror endpoint responsible for sending the message to the primary endpoint responsive to storing the at least one object at the second fabric attached memory endpoint.

18. The memory fabric of claim 17 wherein:
the first non-volatile memory media comprises storage class memory;
a first media controller of the first fabric attached memory endpoint comprises a cache, the cache comprising persistent memory; and
the first media controller is configured to send the single acknowledgement responsive to storing the at least one object in the cache prior to writing the at least one object stored in the cache to the first non-volatile memory media.

19. The memory fabric of claim 17 wherein:
the second non-volatile memory media comprises storage class memory;
a second media controller of the second fabric attached memory endpoint comprises a cache, the cache comprising persistent memory; and
the second media controller is configured to send the acknowledgment to the first fabric attached memory endpoint responsive to storing the at least one object in the cache prior to writing the at least one object stored in the cache to the second non-volatile memory media.

20. The memory fabric of claim 17 wherein a first media controller of the first fabric attached memory endpoint is configured to receive, over a messaging connection between the first media controller and a second media controller of the second fabric attached memory endpoint, the message indicating that the at least one object has been stored by the second fabric attached memory endpoint.

* * * * *